United States Patent [19]
Todd et al.

[11] Patent Number: 5,402,124
[45] Date of Patent: Mar. 28, 1995

[54] ENCODER AND DECODER WITH IMPROVED QUANTIZER USING RESERVED QUANTIZER LEVEL FOR SMALL AMPLITUDE SIGNALS

[75] Inventors: Craig C. Todd, Mill Valley; Mark F. Davis, Pacifica, both of Calif.

[73] Assignee: Dolby Laboratories Licensing Corporation, San Francisco, Calif.

[21] Appl. No.: 981,286

[22] Filed: Nov. 25, 1992

[51] Int. Cl.$^6$ ............................................. H03M 1/18
[52] U.S. Cl. ..................................................... 341/131
[58] Field of Search ............... 341/131, 110, 200, 144, 341/155; 375/26; 381/29, 30, 31, 32, 33, 34, 35, 40, 41

[56] References Cited

U.S. PATENT DOCUMENTS

| | | | |
|---|---|---|---|
| 3,999,129 | 12/1976 | Kasson | 375/26 |
| 4,972,484 | 11/1990 | Theile et al. | 381/37 |
| 5,222,189 | 6/1993 | Fielder | 395/2 |

OTHER PUBLICATIONS

Lipshitz, Vanderkooy and Wannamaker, "Minimally Audible Noise Shaping," *IEEE J. Audio Eng. Soc.*, vol. 39, No. 11, Nov. 1991, pp. 836–852.

*Primary Examiner*—Brian K. Young
*Attorney, Agent, or Firm*—David N. Lathrop; Thomas A. Gallagher

[57] ABSTRACT

The invention relates in general to the quantization of digital signal information. More particularly, the invention relates to the reduction of perceptible effects of quantizing noise by reserving a special quantizing level for low-level signals in encoding and decoding applications.

35 Claims, 10 Drawing Sheets

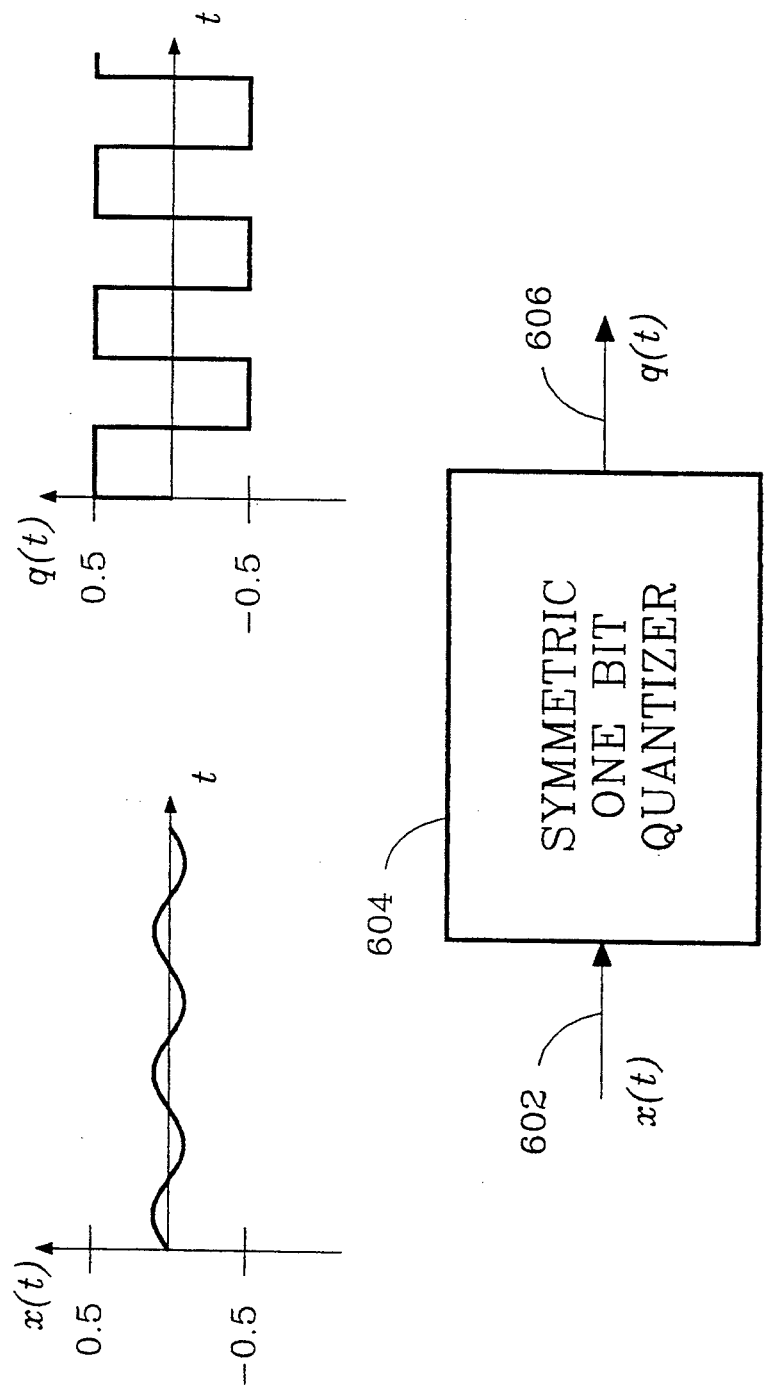

ENCODER AND DECODER WITH IMPROVED QUANTIZER USING RESERVED QUANTIZER LEVEL FOR SMALL AMPLITUDE SIGNALS

TECHNICAL FIELD

The invention relates in general to the quantization of digital signal information. More particularly, the invention relates to quantization of digital audio signal information which reduces the audible effects of quantizing noise for low-level audio signals in encoding and decoding applications.

BACKGROUND ART

There is considerable interest among those in the field of digital signal processing to reduce the amount of information required to transmit or store a digital signal intended for human perception without degrading its subjective quality. Informational requirements of digital signals can be reduced by quantizing the signal with fewer binary bits, but quantizing with fewer bits increases errors in the encoded representation. If the magnitude of these errors is large enough, the quantizing inaccuracy is perceptible.

Throughout this discussion, the terms "quantizing" and "quantization" refer to the process of representing signal information as a discrete value. In applications using binary representations, quantized values are expressed by binary bits. Although binary representations are assumed herein for ease of discussion, it should be realized that the present invention and the problems it solves are not limited to binary representations. The terms "dequantizing" and "dequantization" refer to the process of obtaining a representation of the signal information conveyed by quantized values. The terms "quantizer" and "dequantizer" refer to means for performing quantization and dequantization, respectively. The quantizing "step size" is the smallest interval between quantized values and it is inversely related to the number of bits used to represent quantized values. The "quantizing error" is the magnitude of the difference between a quantized value and the value of the signal information it represents and is directly related to the quantizing step size.

In audio coding applications, quantizing errors may manifest themselves as noise. If the quantizing step size is too large, the quantizing noise will be audible and the subjective quality of the encoded signal will be degraded.

"Split-band" coding techniques such as subband coding and transform coding claim to reduce informational requirements of audio signals without any audible degradation by exploiting various psychoacoustic effects such as psychoacoustic masking. See generally, the *Audio Engineering Handbook*, K. Blair Benson ed., McGraw-Hill, San Francisco, 1988, pages 1.40–1.42 and 4.8–4.10. Such split-band techniques exploit a characteristic of human hearing; a stronger signal may mask or render inaudible a weaker signal if the two signals are sufficiently close in frequency. By splitting an audio signal into narrow frequency bands and quantizing the signal energy in each band, the aural effect of the quantizing noise will be confined to the same frequency band as the quantized spectral energy. By using a separate quantizing step size for each frequency band, the quantizing noise can be kept just small enough so that it is masked by the spectral energy. A common technique used in split-band coders for keeping quantizing noise small enough is to adjust the quantizing step size in each frequency band according to the amplitude of the signal energy in the respective frequency band.

Subband coders generate samples for each frequency subband of the input signal. A subband coder ideally quantizes subband samples using the fewest number of bits possible such that the quantizing noise in each subband is masked by the signal energy in that subband and in neighboring subbands.

Transform coders generate a block of short-time frequency-domain coefficients for each time interval of the input signal. A transform coder ideally quantizes each coefficient using the fewest number of bits possible such that quantizing noise for each coefficient is masked by the signal energy in that coefficient and in neighboring coefficients.

Many split-band encoders encode a 20 kHz bandwidth signal, sampled at a rate in excess of 44 kilosamples per second, into a digital signal of no more than 128 kilobits per second. This bit rate implies that an average of less than 3 bits are used to quantize each subband sample and transform coefficient for subband and transform coders, respectively.

Signal information quantized with 3 bits may have any one of $2^3$ or eight discrete values. A 3-bit value expressed in a linear binary representation known as "two's complement" can have any one of eight quantizer output values $-4, -3, -2, -1, 0, 1, 2$ and $3$. The output $q(x)$ of a 3-bit two's complement quantizer changes by an amount equal to the quantizer step size as the input value x crosses quantizing "thresholds." As shown in FIG. 3, for example, the quantizing thresholds may be established at $-3.5, -2.5, -1.5, -0.5, 0.5, 1.5$ and $2.5$. The quantizing function shown in FIG. 3 is asymmetric, that is, the output of this two's complement quantizer is not symmetric about zero because a 3-bit quantized value can have any of four negative values, three positive values, or zero.

The function q(X) shown in FIG. 3 is equal to the value of x rounded to the nearest integer. It is a rounding function and is only one example of a two's complement quantizing function. Many other quantizing functions are possible. For example, a truncating function can be obtained by simply shifting the stair-step function shown in FIG. 3 by 0.5 to the right along the x axis. Although the following discusses only a few quantizing functions, it should be appreciated that the principles and concepts discussed are applicable to a wide range of quantizing functions.

Asymmetric quantizers inherently introduce a bias into the quantized values. This effect may be more easily appreciated by considering the effect of quantizing an unbiased time-domain sinusoid signal x(t) with a 1-bit two's complement quantizer having a quantizing threshold at $-0.5$ as shown in FIGS. 5a–5c. Quantizer 504 generates a biased discrete representation q(t) along path 506 in response to unbiased signal x(t) received along path 502. It should be pointed out that the signals x(t) and q(t) shown in FIGS. 5a and 5c, and in various other figures referred to herein, are represented as continuous-time signals. These figures are intended to represent only the envelope of discrete-time signals.

The portion of signal x(t) below the quantizing threshold is quantized with a value of $-1$ and the remainder of signal x(t) is quantized with a value of zero. The quantized output q(t) is a square wave having a bias or average Value less than zero. The value of the bias depends upon the amplitude of signal x(t) relative to the quantizing threshold. The biasing effect of asymmetric quantizers also applies to signals in other domains such as the frequency domain.

The biasing effect of asymmetric quantizers is not desirable in split-band coders because it can significantly distort the spectral energy content of the encoded signal. Such distortion cannot be easily removed by a companion split-band decoder.

Symmetric quantizers do not introduce bias into quantized values. A two's complement 3-bit quantizer can be made symmetric by adjusting the quantizer output values and quantizing thresholds. For example, the asymmetric quantizing function shown in FIG. 3 can be made symmetric by adjusting the quantizing output values to be $-3.5, -2.5, -1.5, -0.5, 0.5, 1.5, 2.5$ and $3.5$, and by adjusting the quantizer thresholds to be $-3, -2, -1, 0, 1, 2$ and $3$. The result of these adjustments is shown in FIG. 4. By using such a quantizing function in a 1-bit symmetric quantizer with a quantizer threshold at 0 as shown in FIGS. 6a–6c, an unbiased sinusoid signal is quantized into an unbiased square wave which alternates between the values $-0.5$ and $0.5$.

Unfortunately, such a symmetric quantizer generates substantial quantizing noise for very low level signals. This effect in the time domain is illustrated in FIGS. 6a–6c. Quantizer 604 generates a relatively large amplitude representation q(t) along path 606 in response to the relatively small amplitude signal x(t) received along path 602. The quantized output q(t) for such a small amplitude signal x(t) is the same as that for a signal with a much larger amplitude, for example, one whose amplitude ranges from $-0.99$ to $0.99$. This effect is applicable to signals in other domains such as the frequency-domain. For many applications, a quantizer should ideally produce an output equal to or approximately equal to zero for very small amplitude signals.

Dithering is one technique which is sometimes used to compensate for adverse affects of symmetric quantizers by randomizing the quantizing error. Dithering can also improve the resolution of small values. Such dithering adds a random-valued component to the signal value prior to quantization; the amplitude of the random-valued component is generally on the order of the quantizing step size. But dithering is not desirable in situations where there is little or no signal energy because a random noise-like signal is created where essentially no signal existed before.

Dithering may also be used to advantageous effect in a split-band decoder after dequantization because it also tends to randomize quantizing errors, producing a noise-like effect which is often less obtrusive than that caused by the quantizing errors alone. In transform decoders, for example, quantizing errors tend to produce tone-like components because the quantizing errors are in the frequency domain. Dithering in a split-band decoder is not always desirable because, unless corrective measures are taken, it will significantly increase the apparent level of quantizing noise for values which are much smaller than the quantizing step size. Dithering should be used in a decoder only in situations where the signal magnitude is not substantially less than the quantizing step size, but without "side information," this signal information is available only in the encoder. Generally the use of such "side information" is not desirable because the bits required to carry the side information increases the informational requirements of the coded signal.

DISCLOSURE OF INVENTION

It is an object of the present invention to provide for a split-band encoder which quantizes frequency-band signals without introducing bias into the quantized values.

It is another object of the present invention to provide for a split-band encoder which quantizes frequency-band signals without generating substantial quantizing errors for small amplitude signal information which varies above and below zero.

It is a further object of the present invention to provide to a split-band decoder additional information about frequency-band signals having an amplitude "significantly" less than the smallest nonzero magnitude quantizing level. The amplitude of a signal is said to be "significantly" less than the smallest nonzero magnitude quantizing level whenever an encoder/decoder system can obtain a Significant improvement in performance because the decoder has the additional information concerning the small-amplitude signal.

In accordance with the teachings of one aspect of the present invention in one embodiment, a split-band encoder quantizes frequency-band signals using a quantizer wherein one quantization level is reserved to represent a "small zero" signal, that is, frequency-band signals having an amplitude significantly less than the smallest nonzero magnitude quantizing level.

FIG. 7, for example, illustrates one embodiment of a 3-bit two's complement quantizer according to one aspect of the present invention. Seven of the eight possible quantization levels ranging from $-3$ to $3$ are used for normal quantization of frequency-band signals and quantization level $-4$ is reserved to represent a "small zero" signal. For example, as shown in FIG. 7, the "small zero" quantization level is reserved to represent signal information which falls within the range from $-0.25$ to $0.25$. Thus, a symmetric quantizer is achieved which does not introduce a bias into the quantized values and which can convey to a decoder the presence of a small amplitude signal.

The quantizing function q(x) shown in FIG. 7 deserves some additional explanation. In some applications such as those within transform coders, the signal x is transform coefficients representing spectral amplitudes. The quantizing function q(x) as shown in FIG. 7 is a conventional function of x.

In other applications such as those within subband coders wherein the signal x is a time-domain signal, it should be understood that the quantizing function q(x) within the "small zero" domain does not necessarily represent a function of the instantaneous value of x but rather a function of the amplitude of signal x. The "small zero" quantization level may be reserved only for signals x whose amplitude is substantially zero; it is not necessarily used to represent portions of larger amplitude signals in the vicinity of their zero crossings. This effect is illustrated in FIGS. 9a–9c and is discussed in more detail below.

The figures and following discussion illustrate embodiments of quantizers whose output is controlled by the peak-to-peak amplitude of time-domain signal x(t). Other measures of amplitude may be used including root-mean-square and the absolute value of transform coefficients. The specific measure of amplitude is not critical to the practice of the present invention.

Also in accordance with the teachings of one aspect of the present invention in other embodiments, a split-band encoder may suppress the application of, or reduce the amplitude of, dither to frequency-band signals which are to be represented by the "small zero" quantization level.

Further in accordance with the teachings of one aspect of the present invention for one embodiment, a split-band decoder may suppress the application of, or reduce the amplitude of, dither after dequantization to frequency-band signals which were represented by the "small zero" quantization level.

The present invention is not limited in its application to either asymmetric or symmetric quantizers, and it is not limited to linear quantization. Specific quantization functions, quantizing levels and quantizing thresholds are discussed herein, but it should be understood that these are provided only as examples and should not be understood to limit application of the present invention.

The various features of the present invention and its preferred embodiments are set forth in greater detail in the following "Modes for Carrying Out the Invention" and in the accompanying drawings. Although the foregoing and following discussions are more particularly directed toward split-band audio coding applications, the present invention is not so limited. For example, the present invention is applicable to the coding of split-band as well as wide-band signals, and it may be applied to other types of signals such as video signals. Furthermore, the present invention may be utilized in coders which operate in a variety of domains such as the time domain, the frequency domain, and the horizontal and vertical domains of encoded images.

BRIEF DESCRIPTION OF THE DRAWINGS

FIGS. 6a–6c collectively are a hypothetical graphical illustration of a 1-bit symmetric two's complement quantizer generating substantial quantizing noise in response to a very small amplitude signal.

MODES FOR CARRYING OUT THE INVENTION

A. Principal Embodiment

Figure 1:
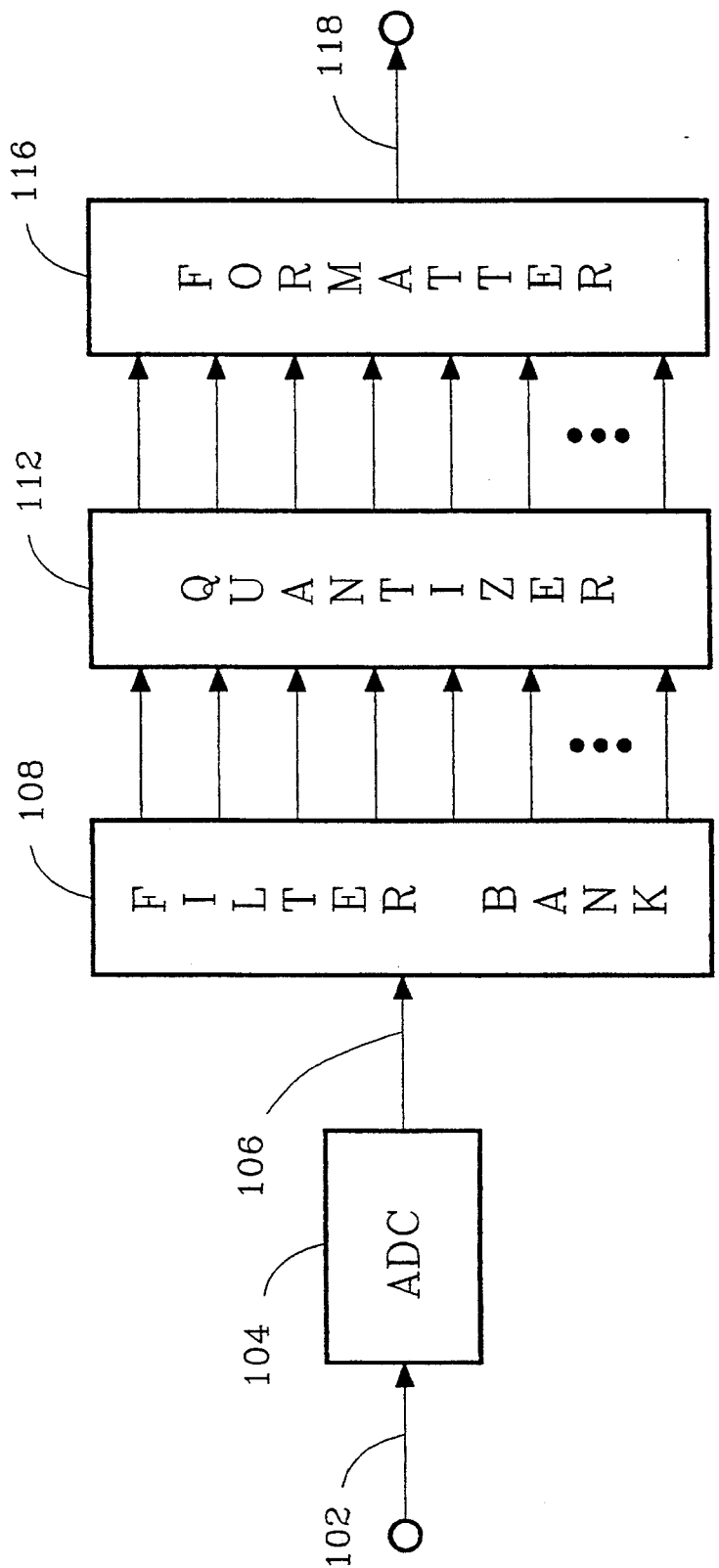
FIG. 1 is a functional block diagram of a split-band encoder incorporating a quantizer.

FIG. 1 illustrates a functional block diagram of a split-band encoder incorporating a quantizer. Analog-to-digital converter (ADC) 104 generates a digital signal in response to an analog input signal received along path 102. Filter bank 108 receives the digital signal along path 106 and generates frequency-band signals. Quantizer 112 quantizes the frequency-band signals. Formatter 116 assembles the quantized frequency-band signals into a form suitable for transmission or storage along path 118. As discussed above, filter bank 108 may be implemented by applying techniques such as subband filtering, transforms, or any other method which can generate frequency-band signals in response to the input signal.

An embodiment of an encoder does not require either ADC 104, filter bank 108, or formatter 116 to practice the invention. ADC 104 is not required, for example, to encode an input signal which is in a digital Pulse Code Modulation (PCM) form. Also by way of example, filter bank 108 is not required for wideband signal encoders. Formatter 116 is not required, for example, in applications which do not require the insertion of Error Detection-Correction (EDC) codes or which do not require multiplexing the quantized frequency-band signals into a serial bit stream.

Figure 2:
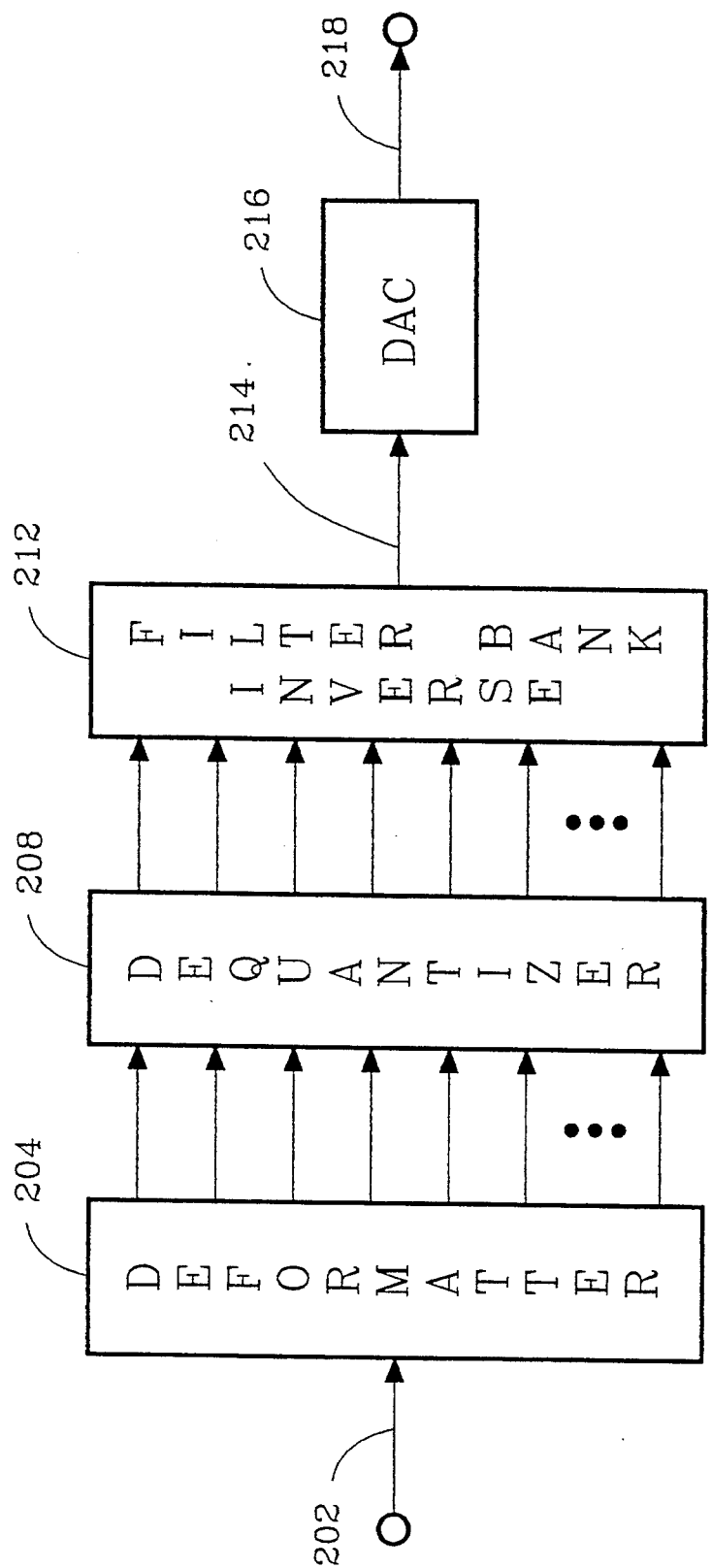
FIG. 2 is a functional block diagram of a split-band decoder incorporating a dequantizer.
Figure 3:
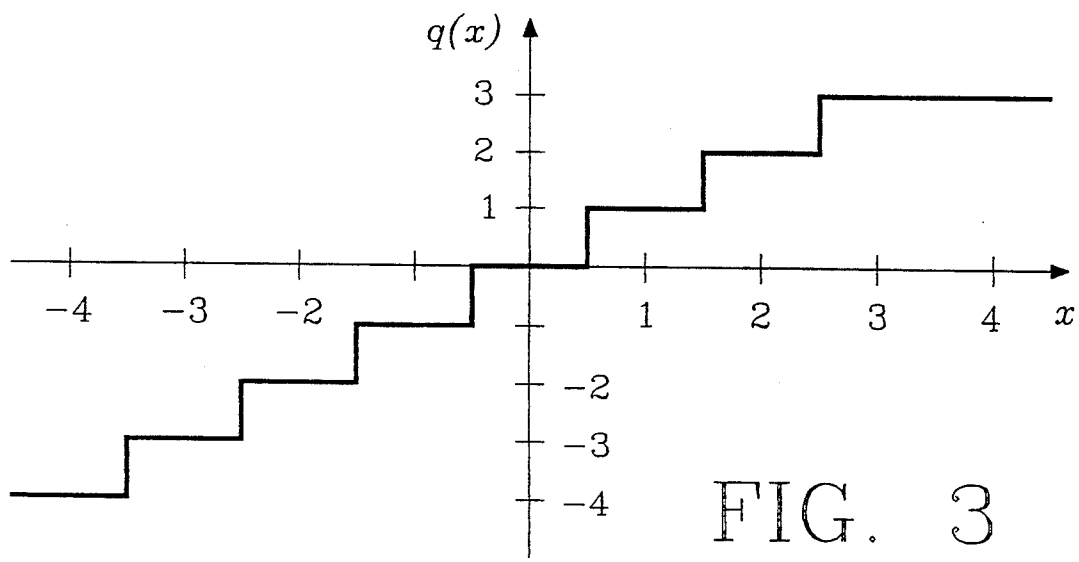
FIG. 3 is a hypothetical graphical illustration of the quantizing function in an asymmetric 3-bit two's complement quantizer.
Figure 4:
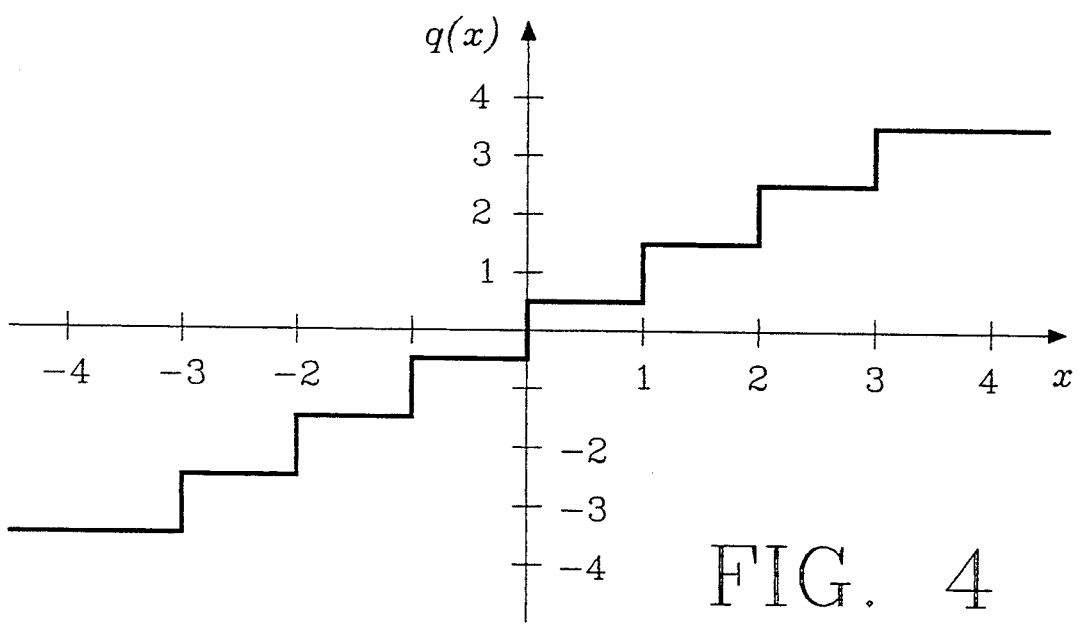
FIG. 4 is a hypothetical graphical illustration of the quantizing function in a symmetric 3-bit two's complement quantizer.
Figures 5A, 5B, 5C:
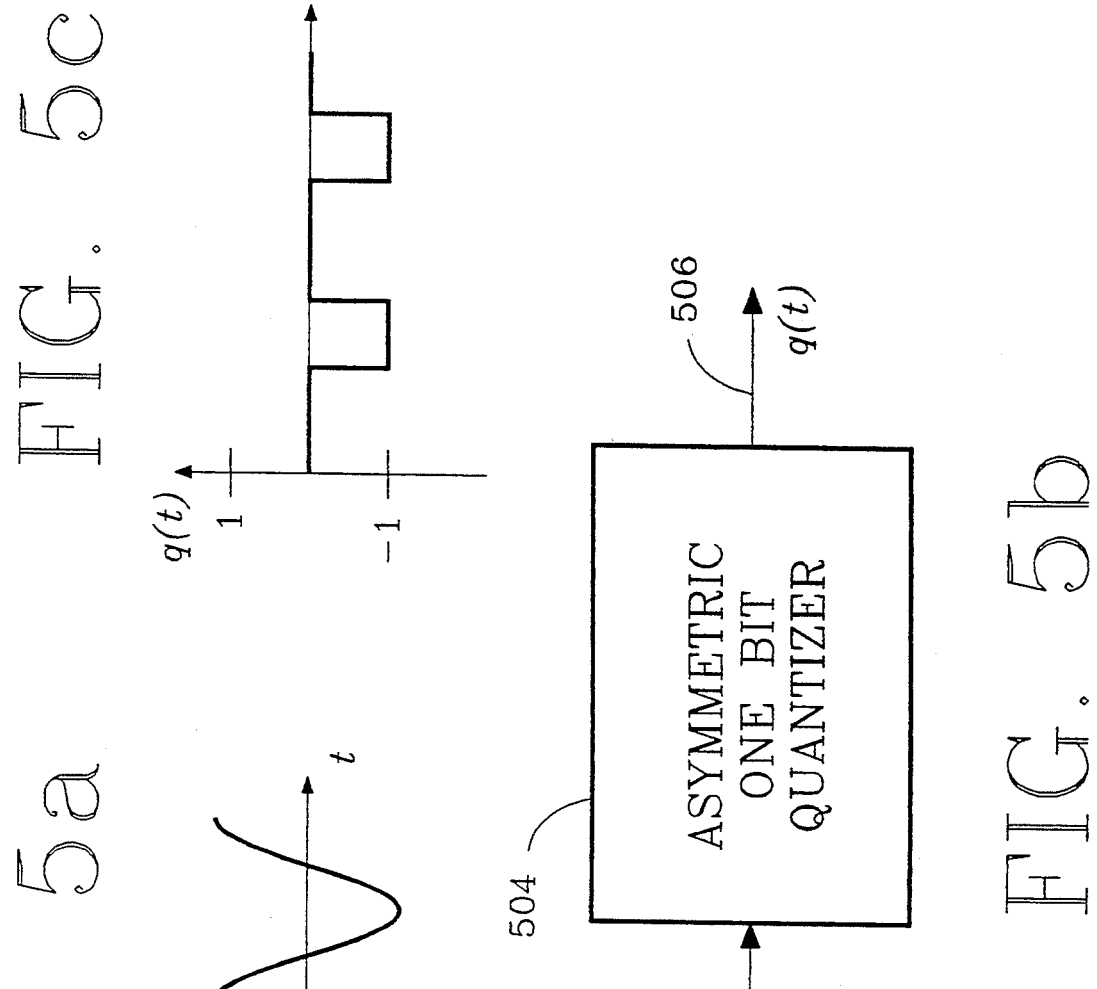
FIGS. 5a–5c collectively are a hypothetical graphical illustration of a 1-bit asymmetric two's complement quantizer introducing bias into a quantized signal in response to an unbiased sinusoid signal.

FIG. 2 illustrates a functional block diagram of a split-band decoder incorporating a dequantizer. Deformatter 204 disassembles a formatted signal received along path 202. Dequantizer 208 dequantizes the disassembled signal information into frequency-band signals. Inverse filter bank 212 generates a digital signal along path 214 in response to the dequantized frequency-band signals. Digital-to-analog converter (DAC) 216 generates an analog signal along path 218 in response to the digital signal received along path 214.

An embodiment of a decoder does not required either deformatter 204, inverse filter bank 212, or DAC 216 to practice the invention. Deformatter 204 is not required, for example, to receive encoded signals along path 202 which do not contain EDC codes or which are not a multiplexed serial bit stream. Also by way of example, inverse filter bank 212 is not required for wideband signal decoders. DAC 216 is not required, for example, in decoders which generate digital PCM output signals.

Quantizer 112 and dequantizer 208 may be implemented by either a single function which is applied sequentially to each frequency-band signal path, or they may be implemented by a plurality of functions which are applied in parallel to two or more of the frequency-band signal paths.

Furthermore, quantizer 112 and dequantizer 208 may operate in conjunction with or as a part of an adaptive bit allocation process. An example of an encoder/decoder system employing adaptive bit allocation is set forth in international publication WO 92/12607, published Jul. 23, 1992 which is hereby incorporated by reference in its entirety. Adaptive bit allocation is not within the scope of the present invention, however, and is not discussed further.

Figure 7:
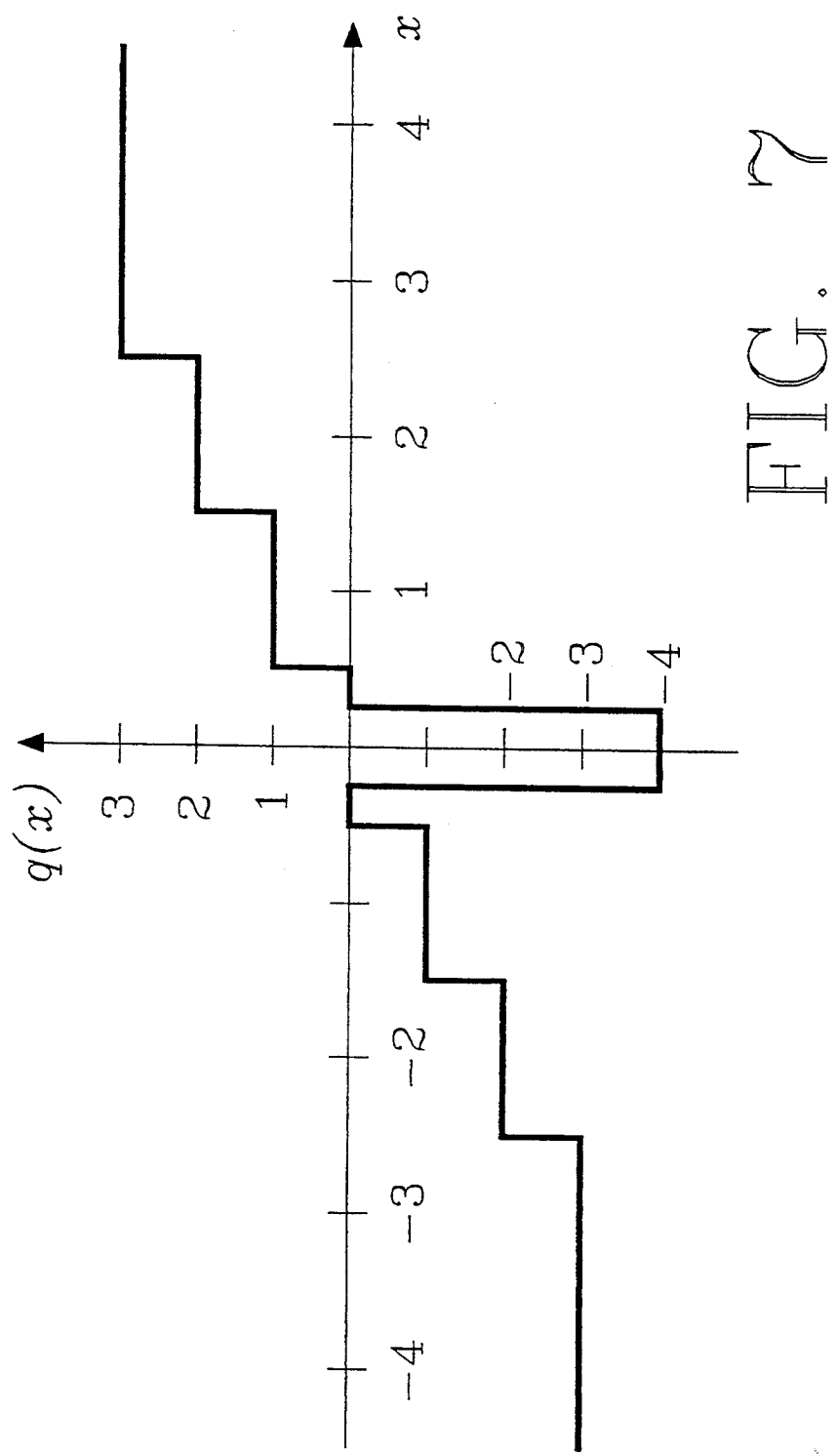
FIG. 7 is a hypothetical graphical illustration of the quantizing function in one embodiment of a symmetric 3-bit two's complement quantizer according to various aspects of the present invention.

An example of a 3-bit linear two's complement quantizing function q(x) embodied by an encoder according to one aspect of the present invention is shown in FIG. 7. Function q(x) is symmetric and reserves quantization level −4 to represent signal information having an amplitude which is significantly less than the smallest non-zero magnitude quantizing level. The operating characteristics of this quantizing function in response to a time-domain signal are shown in FIGS. 8a–8c and 9a–9c. As discussed above, the specific quantizing levels and thresholds shown in FIG. 7 and elsewhere and discussed herein are shown by way of example only. The quantizing function is applicable to signals in other domains such as the frequency domain.

Figure 8A:
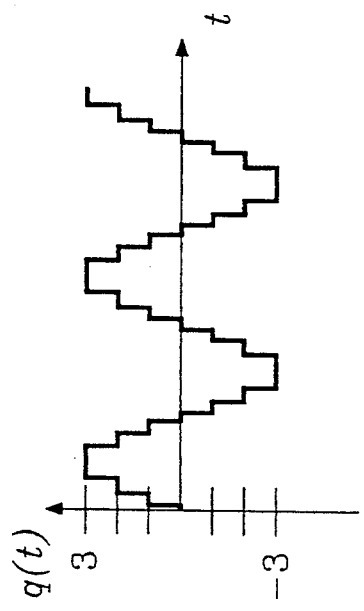
FIGS. 8a–8c collectively are a hypothetical graphical illustration of one embodiment of an improved 3-bit two's complement quantizer according to various aspects of the present invention generating an unbiased quantized signal in response to an unbiased time-domain sinusoid signal.
Figure 8C:
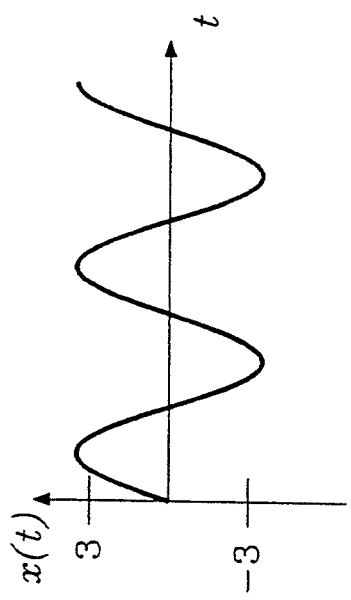
Figure 8B:
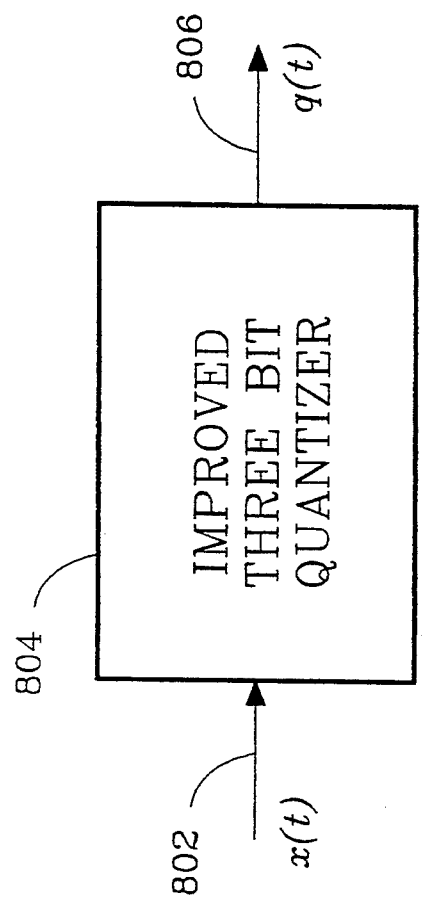

FIGS. 8a–8c illustrate that 3-bit two's complement quantizer 804 generates an unbiased discrete representation q(t) along path 806 in response to unbiased time-domain signal x(t) received along path 802.

Figure 9A:
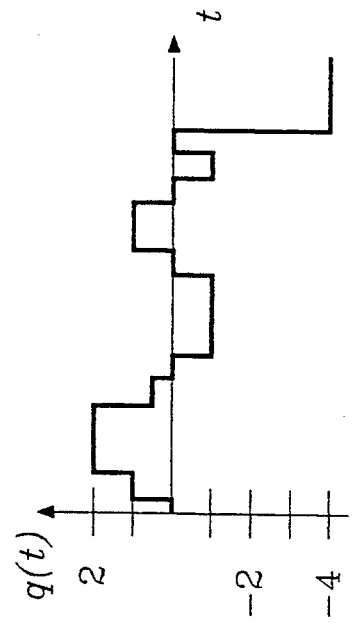
FIGS. 9a–9c collectively are a hypothetical graphical illustration of one embodiment of an improved 3-bit two's complement quantizer according to various aspects of the present invention generating a quantized signal having a "small zero" quantization level reserved for very small amplitude signals.
Figure 9C:
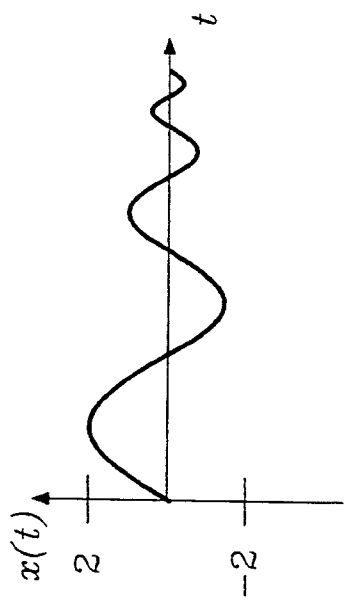
Figure 9B:
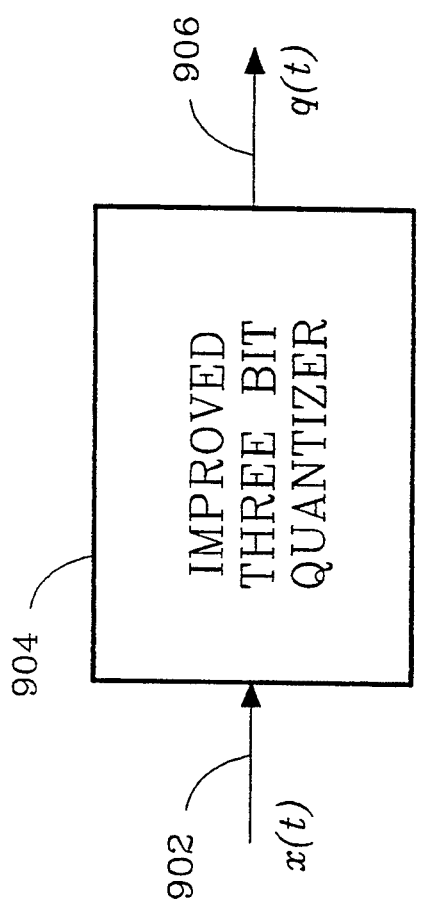

FIGS. 9a–9c illustrate that 3-bit two's complement quantizer 904 generates along path 906 representation q(t) at quantization level −4 in response to time-domain signal x(t) received along path 902 having a very small amplitude. More particularly for the embodiment shown, q(t) is set to −4 in response to those portions of x(t) having an amplitude of 0.25 or less. The output of the quantizer shown in FIG. 9c shows that the "small zero" quantization level may be reserved only for signals having a small amplitude and does not necessarily apply to portions of larger amplitude signals at or near their zero crossings.

B. Alternate Embodiment

Figure 10:
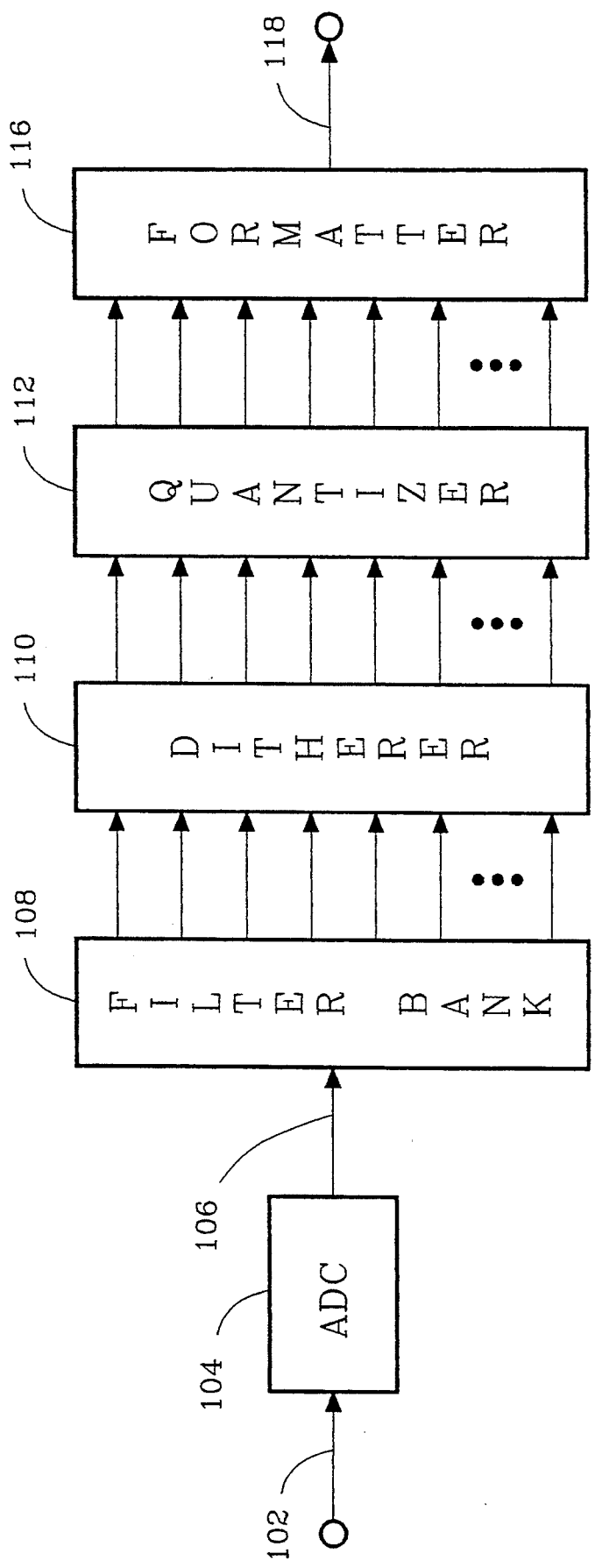
FIG. 10 is a functional block diagram of a split-band encoder incorporating a quantizer preceded by a ditherer.

FIG. 10 illustrates a functional block diagram of a split-band encoder incorporating a ditherer and a quantizer. The previous discussion of FIG. 1 applies generally to the embodiment illustrated in FIG. 10 except that ditherer 110 modifies the frequency-band signals prior to quantization by quantizer 112.

Figure 11:
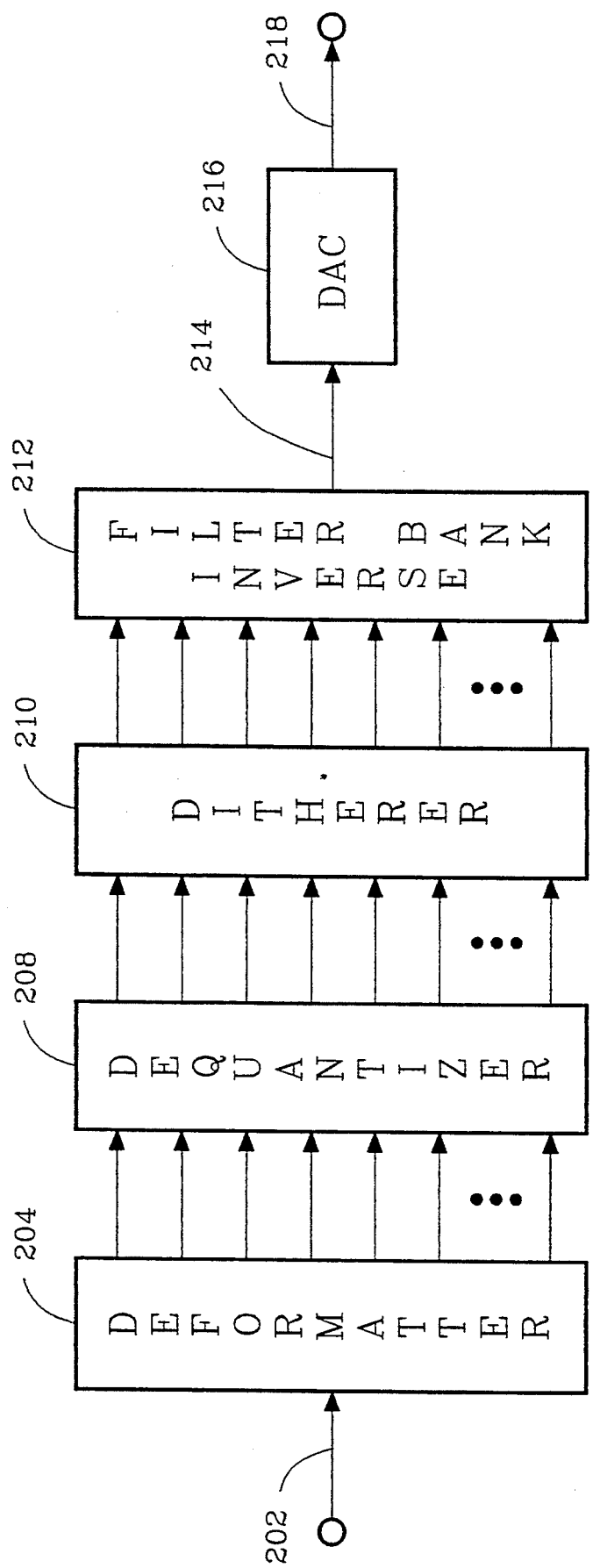
FIG. 11 is a functional block diagram of a split-band decoder incorporating a dequantizer followed by a ditherer.

FIG. 11 illustrates a functional block diagram of a split-band decoder incorporating a dequantizer and a ditherer. The previous discussion of FIG. 2 applies generally to the embodiment illustrated in FIG. 11 except that ditherer 210 modifies the frequency-band signals after dequantization by dequantizer 208;

The specific forms of the quantizing function and the dithering function are not critical to the practice of the present invention. As discussed below, one embodiment of a split-band encoder comprising a truncating quantizing function adds a dither component to frequency band signals and one embodiment of a companion decoder subtracts a corresponding dither component from the received frequency band signals. Other quantizing functions and forms of dither may be utilized.

It should be appreciated that various combinations of dithering may or may not be applied in an encoder and a companion decoder without departing from the scope of the present invention. For example, dither may be Used in an encoder but in a decoder, dither may be not be used in an encoder and but used in a decoder, or dither may be used in both or neither of an encoder and a decoder.

1. Encoder

Referring to FIG. 10, ditherer 110 is used to reduce the audible effects of quantizing errors by adding a dither component to the frequency-band signals prior to quantization. In one implementation of an encoder according to one aspect of the present invention, the dither amplitude is adapted according to the quantizing step size such that the mean amplitude of the dither component matches the expected quantizing error.

For example, in an encoder using a two's complement representation in which frequency-band signal information is 8 bits in length, such signal information may be represented by the notation $\#.\#\#\#\#\#\#\#_2$ which is a string of seven binary symbols $\#$ following the binary point, and a single binary symbol $\#$ prior to the binary point which represents the sign. Each symbol $\#$ may have a value of either 0 or 1. The 8-bit string $0.1100000_2$ represents the quantity $0.75_{10}$, for example. Assuming that the quantizing step size is established as $0.01_2$, quantized values of the form $\#.\#\#_2$ can be generated by truncating the 8-bit representation to 3 bits; thus, the minimum and maximum value of the quantizing error is $0.0000000_2$ and $0.0011111_2$, respectively. The audible effects of this quantizing error may be reduced by adding a dither component to each 8-bit value before it is quantized. The dither component can be produced by a pseudo-random number generator which generates values uniformly within the range bounded by the minimum and maximum quantizing errors. Other 5methods or sources of dither are possible and may be preferable for certain applications.

The encode process which generates dither may be periodically reinitialized, and a "reset" flag may be included in the encoded signal which a companion decoder can use to synchronize a complementary process. The period between successive reinitialization is not critical but for audio applications is preferably in the range of from 50 milliseconds to two seconds. Shorter periods may cause the process to generate audible artifacts. Longer periods increase the time required for a companion decoder to initialize or to reinitialize after synchronization is lost.

In one embodiment the reset flag is a single bit. In another embodiment the reset flag comprises two or more bits which provides an index into a table of values used to seed a pseudo-random random number generator which generates a noise-like signal.

In situations where little or no frequency-band signal information is present, the dither component may be audible unless signal information in neighboring frequency-bands can mask it. Therefore, it is often desirable to suppress dithering or reduce the amplitude of the dither component for very small amplitude signals. In one embodiment of an encoder according to one aspect of the present invention, dithering is inhibited for frequency-band signals having an amplitude such that the quantizer will quantize the signal at the "small zero" quantization level.

2. Decoder

Referring to FIG. 11, ditherer 210 is used to reduce the audible effects of quantizing errors by adding a dither component to the frequency-band signals after dequantization. In one implementation of a decoder according to one aspect of the present invention, the dither amplitude is adapted according to the quantizing step size used in a companion encoder such that the mean amplitude of the dither component matches the expected quantizing error.

Conceptually, dithering provides a substitute for the least significant bits of frequency-band signal information which are lost through quantizing because only a limited number of bits are available to represent the signal information. For example, in an encoder/decoder system using two's complement representation in which frequency-band signal information is 8 bits in length, and assuming that the quantizing step size was $0.01_2$, dequantizing without dithering reconstructs signal information of the form $\#.\#\#00000_2$; thus, the string $\#.00\#\#\#\#\#_2$ represents the expected quantizing error.

One justification for dithering is an assumption that the quantizing error is at most barely audible and that the error is statistically similar to noise. Dithering may statistically reconstruct the value of the quantizing error by generating a noise-like signal with the same mean amplitude as the expected quantizing error.

For the case of the quantizing function shown in FIG. 7, dithering may be implemented by a function which generates pseudo-random numbers uniformly within the interval from and including $1.1110000_2$, or $-0.125_{10}$ up to but not including $0.0010000_2$ or $+0.125_{10}$. It should be appreciated that dithering may be implemented by other signal generators including noise generators with different amplitudes, different amplitude probability density functions, and different spectral shapes.

It may not be desirable to use dithering for frequency-bands in which little or no signal is present because dithering will generate a low-level noise signal which may be audible unless signal information in neighboring frequency bands can mask it.

Decoders designed to operate in conjunction with an encoder according to one embodiment discussed above comprise a dithering function complementary to that of the encoder. In response to a "reset" flag in the coded signal, the decoder reinitializes a process which generates a dither component substantially the same as that generated in the companion encoder and subtracted from the dequantized frequency-band signals. For this embodiment, decode dithering is not used in situations where dithering was not used in the companion encoder.

As discussed above, a decoder may suppress dithering or reduce the amplitude of the dither component for "small zero" signals independent of the type of dither, if any, used in the encoder.

We claim:

1. An encoder of a signal comprising
receiver means for receiving said signal, and
quantizer means responsive to said receiver means for quantizing said signal according to a plurality of quantizing levels wherein said quantizer means uses a reserved quantizing level to represent signals having an amplitude significantly less than the smallest nonzero magnitude of said plurality of quantizing levels.

2. An encoder according to claim 1 wherein said quantizer means uses said reserved quantizing level to represent signals having an amplitude substantially equal to or less than one-half said smallest nonzero magnitude.

3. An encoder of a signal comprising
receiver means for receiving said signal,
ditherer means responsive to said receiver means for generating an intermediate signal by applying a dither component to said signal, and
quantizer means responsive to said ditherer means for quantizing said intermediate signal according to a plurality of quantizing levels, wherein said quantizer means uses a reserved quantizing level to represent intermediate signals having an amplitude significantly less than the smallest nonzero magnitude of said plurality of quantizing levels.

4. An encoder according to claim 3 wherein said quantizer means uses said reserved quantizing level to represent intermediate signals having an amplitude substantially equal to or less than one-half said smallest nonzero magnitude.

5. An encoder according to claim 3 wherein said ditherer means suppresses the application of said dither component to signals having an amplitude significantly less than said smallest nonzero magnitude.

6. An encoder according to claim 3 wherein said ditherer means adapts the amplitude of said dither component in response to the amplitude of said signals.

7. An encoder according to claim 3 wherein said ditherer means adapts the amplitude of said dither component in response to the amplitude of signals having an amplitude significantly less than said smallest nonzero magnitude.

8. An encoder according to any one of claims 1 through 7 wherein said quantizer means quantizes signals into an N-bit two's complement representation, and wherein said reserved quantizing level is equal to $-2^{N-1}$.

9. A decoder of a quantized signal generated by an encoder in response to a signal, said encoder comprising a quantizer having a plurality of quantizing levels and a reserved quantizing level to represent signals having an amplitude significantly less than a smallest nonzero magnitude of said plurality of quantizing levels, said decoder comprising
receiver means for receiving said quantized signal, and
dequantizer means responsive to said receiver means for generating a dequantized signal, wherein a small amplitude dequantized signal is generated in response to portions of said quantized signal at said reserved quantizing level.

10. A decoder according to claim 9 wherein said small amplitude dequantized signal has an amplitude substantially equal to or less than one-half the magnitude of the dequantized signal generated in response to said smallest nonzero magnitude quantizing level.

11. A decoder of a quantized signal generated by an encoder in response to a signal, said encoder comprising a quantizer having a plurality of quantizing levels and a reserved quantizing level to represent signals having an amplitude significantly less than a smallest nonzero magnitude of said plurality of quantizing levels, said decoder comprising
dequantizer means responsive to said quantized signal for generating a dequantized signal, wherein a small amplitude dequantized signal is generated in response to portions of said quantized signal at said reserved quantizing level, and
ditherer means responsive to said dequantizer means for generating a modified signal by applying a dither component to said dequantized signal.

12. A decoder according to claim 11 wherein said small amplitude dequantized signal has an amplitude substantially equal to or less than one-half the magnitude of the dequantized signal generated in response to said smallest nonzero magnitude quantizing level.

13. A decoder according to claim 11 wherein said ditherer means suppresses the application of said dither component to said small amplitude dequantized signal.

14. A decoder according to claim 11 wherein said ditherer means adapts the amplitude of said dither component in response to the amplitude of said dequantized signal.

15. A decoder according to any one of claims 9 through 14 wherein said dequantizer means dequantizes signals having an N-bit two's complement representation, and wherein said reserved quantizing level is equal to $-2^{N-1}$.

16. An encoding method of a signal comprising
receiving said signal, and
quantizing said signal according to a plurality of quantizing levels, wherein a reserved quantizing level is used to represent signals having an amplitude significantly less than the smallest nonzero magnitude of said plurality of quantizing levels.

17. An encoding method according to claim 17 wherein said quantizing uses said reserved quantizing level to represent signals having an amplitude substantially equal to or less than one-half said smallest nonzero magnitude.

18. An encoding method of a signal comprising
receiving said signal,
generating an intermediate signal by applying a dither component to said signal, and
quantizing said-intermediate signal according to a plurality of quantizing levels, wherein a reserved quantizing level is used to represent intermediate signals having an amplitude significantly less than the smallest nonzero magnitude of said plurality of levels.

19. An encoding method according to claim 18 wherein said quantizing uses said reserved quantizing level to represent intermediate signals having an amplitude substantially equal to or less than one-half said smallest nonzero magnitude.

20. An encoding method according to claim 18 wherein no dither component is applied to signals having an amplitude significantly less than said smallest nonzero magnitude.

21. An encoding method according to claim 18 wherein the amplitude of said dither component is adapted in response to the amplitude of said signals.

22. An encoding method according to claim 18 wherein the amplitude of said dither component is adapted in response to the amplitude of signals having an amplitude significantly less than said smallest nonzero magnitude.

23. An encoding method according to any one of claims 16 through 22 wherein said quantizing quantizes signals into an N-bit two's complement representation, and wherein said reserved quantizing level is equal to $-2^{N-1}$.

24. A decoding method of a quantized signal generated by an encoding method in response to a signal, said encoding method comprising quantization having a plurality of quantizing levels and a reserved quantizing level to represent signals having an amplitude significantly less than a smallest nonzero magnitude of said plurality of quantizing levels, said decoding method comprising
receiving said quantized signal, and
generating a dequantized signal, wherein a small amplitude dequantized signal is generated in response to portions of said quantized signal at said reserved quantizing level.

25. A decoding method according to claim 24 wherein said small dequantized amplitude signal has an amplitude substantially equal to or less than one-half the magnitude of the dequantized signal generated in response to said smallest nonzero magnitude quantizing level.

26. A decoding method of a quantized signal generated by an encoding method in response to a signal, said encoding method comprising quantization having a plurality of quantizing levels and a reserved quantizing level to represent signals having an amplitude significantly less than a smallest nonzero magnitude of said plurality of quantizing levels, said decoding method comprising
generating a dequantized signal in response to said quantized signal, wherein a small amplitude dequantized signal is generated in response to portions of said quantized signal at said reserved quantizing level, and
generating a modified signal by applying a dither component to said dequantized signal.

27. A decoding method according to claim 26 wherein said small amplitude dequantized signal has an amplitude substantially equal to or less than one-half the magnitude of the dequantized signal generated in response to said smallest nonzero magnitude quantizing level.

28. A decoding method according to claim 27 wherein no dither component is applied to said small amplitude dequantized signal.

29. A decoding method according to claim 26 wherein the amplitude of said dither component is adapted in response to the :amplitude of said dequantized signal.

30. A decoding method according to any one of claims 24 through 30 wherein generating dequantized signals generates signals having an N-bit two's complement representation, and wherein said reserved quantizing level is equal to $-2^{N-1}$.

31. An encoder of a signal comprising
a receiver, and
a quantizer, responsive to said receiver, using a reserved quantizing level to represent signals having an amplitude significantly less than a smallest nonzero quantizing level magnitude.

32. An encoder according to claim 31 wherein said receiver comprises ditherer means for generating an intermediate signal by applying a dither component to said signal, and wherein said quantizer is responsive to said intermediate signal.

33. An encoder according to claim 32 wherein said ditherer means suppresses the application of said dither component to signals having an amplitude significantly less than said smallest nonzero magnitude quantizing level.

34. A decoder of a quantized signal generated by an encoder in response to a signal, said encoder comprising a quantizer using a reserved quantizing level to represent signals having an amplitude significantly less than a smallest nonzero magnitude quantizing level of said quantizer, said decoder comprising
a receiver, and
a dequantizer responsive to said receiver, wherein a small amplitude dequantized signal is generated in response to portions of said quantized signal at said reserved quantizing level.

35. A decoder according to claim 34 further comprising ditherer means responsive to said dequantizer for generating a modified signal by applying a dither component to said dequantized signal, wherein said ditherer means suppresses the application of said dither component to said small amplitude dequantized signal.

* * * * *

UNITED STATES PATENT AND TRADEMARK OFFICE
CERTIFICATE OF CORRECTION

PATENT NO. : 5,402,124
DATED : March 28, 1995
INVENTOR(S) : Craig C. Todd, et al It is certified that error appears in the above-indentified patent and that said Letters Patent is hereby corrected as shown below:

Column 2 line 68 of the patent, "Value" should be --value--;

Column 3 line 34 of the patent, "frequency;-domain" should be --frequency domain--;

Column 4 line 19 of the patent, "Significant" should be --significant--;

Column 7 line 46 of the patent, "208;" should be --208.--;

Column 7 line 60 of the patent, "Used" should be --used--;

Column 8 line 25 of the patent, delete "5";

Column 9 Line 50 of the patent, insert --,-- after "levels";

UNITED STATES PATENT AND TRADEMARK OFFICE
CERTIFICATE OF CORRECTION

PATENT NO. : 5,402,124
DATED : March 28, 1995
INVENTOR(S) : Craig C. Todd, et al It is certified that error appears in the above-indentified patent and that said Letters Patent is hereby corrected as shown below:

Column 11 Line 30 of the patent, insert --quantizing-- before "levels.";

Column 12 line 28 of the patent, ":amplitude" should be --amplitude--.

Signed and Sealed this

Fourteenth Day of October, 1997

Attest:

BRUCE LEHMAN

Attesting Officer

Commissioner of Patents and Trademarks